(12) United States Patent
Liu et al.

(10) Patent No.: US 11,342,537 B2
(45) Date of Patent: May 24, 2022

(54) ORGANIC LIGHT-EMITTING DIODE DEVICE COMPRISING SELF-REPAIRING LAYER AND MANUFACTURING METHOD THEREFOR, DISPLAY SUBSTRATE AND DISPLAY DEVICE

(71) Applicants: FUZHOU BOE OPTOELECTRONICS TECHNOLOGY CO., LTD., Fuzhou (CN); BOE TECHNOLOGY GROUP CO., LTD., Beijing (CN)

(72) Inventors: Chengjun Liu, Beijing (CN); Junyao Yin, Beijing (CN); Wenqin Dai, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 80 days.

(21) Appl. No.: 16/760,201

(22) PCT Filed: Sep. 13, 2018

(86) PCT No.: PCT/CN2018/105477
§ 371 (c)(1),
(2) Date: Apr. 29, 2020

(87) PCT Pub. No.: WO2019/134390
PCT Pub. Date: Jul. 11, 2019

(65) Prior Publication Data
US 2021/0184167 A1 Jun. 17, 2021

(30) Foreign Application Priority Data
Jan. 2, 2018 (CN) .......................... 201810002961.4

(51) Int. Cl.
*H01L 29/08* (2006.01)
*H01L 51/52* (2006.01)
*H01L 51/56* (2006.01)

(52) U.S. Cl.
CPC ...... *H01L 51/5253* (2013.01); *H01L 51/5231* (2013.01); *H01L 51/56* (2013.01)

(58) Field of Classification Search
CPC combination set(s) only.
See application file for complete search history.

(56) References Cited

U.S. PATENT DOCUMENTS 5,952,778 A * 9/1999 Haskal ............... H01L 51/5256
313/504
8,264,141 B2 9/2012 Lee et al.
(Continued)

FOREIGN PATENT DOCUMENTS

CN 101256970 A 9/2008
CN 101667625 A 3/2010
(Continued)

OTHER PUBLICATIONS

First Chinese Office Action in Chinese Patent Application No. 201810002961.4 dated Oct. 30, 2019.
(Continued)

*Primary Examiner* — Caleb E Henry
(74) *Attorney, Agent, or Firm* — Dilworth & Barrese, LLP.; Michael J. Musella, Esq.

(57) ABSTRACT

An organic light-emitting diode device and a manufacturing method thereof, a display substrate, and a display device are provided. The organic light-emitting diode device includes an anode layer, an organic light-emitting layer and a cathode layer which are stacked. The organic light-emitting diode device further includes a self-repairing layer, and the self-repairing layer is arranged on a side of the cathode layer away from the anode layer, and the self-repairing layer is applicable for repairing the cathode layer by an oxidation-reduction reaction.

19 Claims, 6 Drawing Sheets

(56) References Cited

U.S. PATENT DOCUMENTS

| | | | |
|---|---|---|---|
| 9,050,622 B2 | 6/2015 | Aitken et al. | |
| 2004/0191566 A1* | 9/2004 | Kikuchi | H01L 51/5246 |
| | | | 428/690 |
| 2006/0082297 A1* | 4/2006 | Camp | H05K 1/0274 |
| | | | 313/512 |
| 2011/0260201 A1* | 10/2011 | Klein | H01L 51/0097 |
| | | | 257/99 |
| 2015/0179967 A1 | 6/2015 | Hashimoto et al. | |
| 2018/0347797 A1* | 12/2018 | Nicholas | G01J 3/0262 |
| 2019/0375640 A1* | 12/2019 | Alvarez | C01B 32/184 |

FOREIGN PATENT DOCUMENTS

| | | |
|---|---|---|
| CN | 102766862 A | 11/2012 |
| CN | 105280837 A | 1/2016 |
| CN | 106702382 A | 5/2017 |
| CN | 107086228 A | 8/2017 |
| EP | 0684753 A1 | 5/1995 |

OTHER PUBLICATIONS

International Search Report and Written Opinion dated Dec. 17, 2018.

* cited by examiner

ORGANIC LIGHT-EMITTING DIODE DEVICE COMPRISING SELF-REPAIRING LAYER AND MANUFACTURING METHOD THEREFOR, DISPLAY SUBSTRATE AND DISPLAY DEVICE

The present application claims priority of Chinese Patent Application No. 201810002961.4 filed on Jan. 2, 2018, the present disclosure of which is incorporated herein by reference in its entirety as part of the present disclosure.

TECHNICAL FIELD

The present disclosure relates to an organic light-emitting diode device and manufacturing method thereof, a display substrate, and a display device.

BACKGROUND

An OLED (organic light-emitting diode) display device is a display device that uses an organic light-emitting material to emit light by injection and recombination of carriers under the driving of an electric field, and the OLED display device has advantages of self-emission, wide viewing angle, high contrast, low power consumption, high response speed, and so on.

In an encapsulation process of an OLED device in the OLED display device, due to the presence of water vapor and oxygen inside and outside the OLED device, it is easy for the water vapor and oxygen to react with a cathode of the OLED device, which causes point corrosion, so that defect points are formed. Usually, most of the defect points are in the form of microporous vacancies, thus the flatness of the cathode is reduced, adjacent films fall off from the surface, and the electron transport is affected, which further influences the service life of the OLED device.

SUMMARY

At least one embodiment of the present disclosure provides an organic light-emitting diode (OLED) device, and the organic light-emitting diode device includes: an anode layer, an organic light-emitting layer, and a cathode layer which are stacked arranged, the organic light-emitting diode device further includes a self-repairing layer, the self-repairing layer is arranged on a side of the cathode layer away from the anode layer, and the self-repairing layer is applicable for repairing the cathode layer by an oxidation-reduction reaction.

For example, in the organic light-emitting diode device provided by at least one embodiment of the present disclosure, the self-repairing layer includes a transition metal acid salt with a highest valence.

For example, in the organic light-emitting diode device provided by at least one embodiment of the present disclosure, a transition metal in the transition metal acid salt with the highest valence includes at least one of vanadium, manganese and chromium.

For example, in the organic light-emitting diode device provided by at least one embodiment of the present disclosure, the self-repairing layer further includes at least one of zirconium, polyaspartate, fluoroborate and borate.

For example, the organic light-emitting diode device provided by at least one embodiment of the present disclosure further includes a waterproof layer, and the waterproof layer is arranged on a side of the self-repairing layer away from the cathode layer.

For example, in the organic light-emitting diode device provided by at least one embodiment of the present disclosure, a material of the cathode layer includes aluminum or an aluminum alloy.

At least one embodiment of the present disclosure further provides a manufacturing method of an organic light-emitting diode device, which includes: forming an anode layer, an organic light-emitting layer, and a cathode layer that are stacked layer by layer; and forming a self-repairing layer on a side of the cathode layer away from the anode layer, in which the self-repairing layer is applicable for repairing the cathode layer by an oxidation-reduction reaction.

For example, in the manufacturing method provided by at least one embodiment of the present disclosure, the self-repairing layer includes a transition metal acid salt with a highest valence; and the transition metal acid salt with the highest valence is formed by in-situ oxidizing the transition metal acid salt with a lower valence on the cathode layer to form the transition metal acid salt with the highest valence.

For example, in the manufacturing method provided by at least one embodiment of the present disclosure, the forming a self-repairing layer includes: treating the cathode layer with a conversion solution to form a self-repairing conversion layer on the cathode layer, in which the conversion solution comprises the transition metal acid salt with the lower valence; and treating the self-repairing conversion layer with an oxidant solution to convert the transition metal acid salt with the lower valence into the transition metal acid salt with the highest valence and to form the self-repairing layer.

For example, in the manufacturing method provided by at least one embodiment of the present disclosure, a transition metal in the transition metal acid salt with the highest valence includes at least one of vanadium, manganese and chromium.

For example, in the manufacturing method provided by at least one embodiment of the present disclosure, the conversion solution includes at least one of metavanadate, metachromate, manganate, fluoboric acid, potassium fluozirconate, boric acid and sodium metavanadate.

For example, in the manufacturing method provided by at least one embodiment of the present disclosure, the conversion solution includes: the fluoboric acid with a mass concentration of 0.2 g/L to 0.4 g/L, the potassium fluozirconate with a mass concentration of 1.5 g/L to 3 g/L, the boric acid with a mass concentration of 0.2 g/L to 0.4 g/L, and the sodium metavanadate with a mass concentration of 3 g/L to 5 g/L, and a pH of the conversion solution is from 4.0 to 5.0.

For example, in the manufacturing method provided by at least one embodiment of the present disclosure, the treating the cathode layer with a conversion solution to form a self-repairing conversion layer on the cathode layer includes: contacting the cathode layer with the conversion solution, and adding polyaspartate to assist film formation in the process of the treating, in which a mass concentration of the polyaspartate is from 0.4 g/L to 1 g/L.

For example, in the manufacturing method provided by at least one embodiment of the present disclosure, the treating the self-repairing conversion layer with an oxidant solution to convert the transition metal acid salt with the lower valence into the transition metal acid salt with the highest valence includes: treating the self-repairing conversion layer with hydrogen peroxide as the oxidant solution to convert the transition metal acid salt with the lower valence into the transition metal acid salt with the highest valence; in which a mass concentration of the hydrogen peroxide is from 1.5 g/L to 6 g/L, and a pH of the hydrogen peroxide is from 5.0 to 6.0.

For example, the manufacturing method provided by at least one embodiment of the present disclosure, further includes: forming a waterproof layer on a side of the self-repairing layer away from the cathode layer by performing a hydrophobic treatment with an organic substance.

For example, in the manufacturing method provided by at least one embodiment of the present disclosure, the forming a waterproof layer includes: treating the self-repairing layer with a solution containing perfluorosilane to form the waterproof layer.

For example, in the manufacturing method provided by at least one embodiment of the present disclosure, the solution containing the perfluorosilane is an ethanol solution containing the perfluorosilane, and a mass fraction of the perfluorosilane is from 0.1% to 10%.

For example, in the manufacturing method provided by at least one embodiment of the present disclosure, before forming the self-repairing layer, the manufacturing method further includes cleaning the cathode layer and performing a surface activation treatment on the cathode layer.

For example, in the manufacturing method provided by at least one embodiment of the present disclosure, the cleaning the cathode layer includes: treating the cathode layer with an ethanol-water solution including sodium carbonate; in the ethanol-water solution including the sodium carbonate, a volume ratio of the ethanol to the water is 1:4 to 1:3, and a mass concentration of the sodium carbonate is from 8 g/L to 10 g/L; and the performing a surface activation treatment on the cathode layer includes: activating a surface of the cathode layer by using nitric acid; and a mass fraction of the nitric acid is from 10% to 15%.

At least one embodiment of the present disclosure further provides a display substrate, and the display substrate includes any one of the organic light-emitting diode devices mentioned above.

At least one embodiment of the present disclosure further provides a display device, which includes the display substrate.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first", "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

Figure 1:
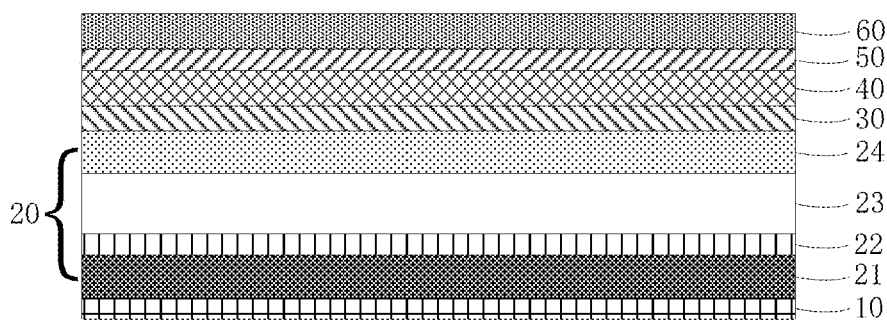
FIG. 1 is a schematic structural diagram of an organic light-emitting diode device provided by an embodiment of the present disclosure.

At least one embodiment of the present disclosure provides an organic light-emitting diode device, and electrodes in the organic light-emitting diode device have better performance FIG. 1 is a schematic structural diagram of an organic light-emitting diode device provided by an embodiment of the present disclosure.

As shown in FIG. 1, the organic light-emitting diode (OLED) device provided by the embodiment includes an anode layer 10, an organic light-emitting layer 20, a cathode layer 30, and a self-repairing layer 40. The anode layer 10, the organic light-emitting layer 20 and the cathode layer 30 are stacked, and the self-repairing layer 40 is arranged on a side of the cathode layer 30 away from the anode layer 10. The self-repairing layer 40 can repair the cathode layer 30 by an oxidation-reduction reaction. For example, after the cathode layer 30 is corroded by water vapor and oxygen, etc., the self-repairing layer 40 can re-passivate a corroded cathode layer base by the oxidation-reduction reaction, so that corrosion points are repaired, a flatness of the cathode layer is increased, and a good stability of a surface of the cathode layer is maintained.

In the embodiment, the self-repairing layer is disposed on the cathode layer in the organic light-emitting diode device, which enhances the working stability of the cathode layer, and effectively avoids a problem such as electrode failure in the organic light-emitting diode device, and the luminous efficiency and the service life of the organic light-emitting diode device are further improved.

For example, the self-repairing layer 40 contains a transition metal acid salt with a highest valence; in this situation, the transition metal exists in a form of the highest valence in the film layer structure of the self-repairing layer 40, to realize a construction of network oxide film system. For example, in a case that the cathode layer 30 is corroded by water vapor and oxygen, etc., because an equilibrium system is damaged, transition metal acid ions with a high valence can enter microporous defects of the cathode layer through a corrosive medium to polymerize and form a secondary protection to the cathode layer; for example, the cathode layer base is re-passivated by an oxidation-reduction reaction so as to repair the corrosion points, increase the flatness of the cathode layer, and maintain the good stability of the surface of the cathode layer. In the present embodiment, the highest valence may refer to the highest valence that the transition metal can have in a case that the transition metal is in an acid ion state; for example, the highest valence of vanadium (V) is +5.

For example, the transition metal acid salt with the highest valence is obtained by in-situ oxidizing the transition metal acid salt with a lower valence on the cathode layer 30. In the present embodiment, the transition metal acid salt with the highest valence is obtained by in-situ oxidizing the transition metal acid salt with the lower valence on the cathode layer, so that it is easier for the transition metal acid ions with the high valence to enter the microporous defects of the cathode layer through the corrosive medium to polymerize and form the secondary protection to the cathode layer, and to re-passivate the cathode layer base by the oxidation-reduction reaction, and thus the cathode layer is better repaired. In the present embodiment, the highest valence may refer to the highest valence that the transition metal can have in a case that the transition metal is in an acid ion state, for example, the highest valence of vanadium (V) is +5; the lower valence may refer to a lower valence that the transition metal can have relative to the highest valence in the case that the transition metal is in an acid ion state, for example, the lower valence of vanadium (V) includes +4, +3, +2. For example, for vanadium, the lower valence is +3 in the case that metavanadate is formed, that is, for vanadium, the transition metal acid salt with the lower valence can be metavanadate.

For example, the transition metal includes at least one selected from the group consisting of vanadium (V), manganese (Mn), and chromium (Cr). All the high valence acid salts of these transition metals have strong oxidation properties.

In some embodiments, the self-repairing layer 40 may further include zirconium (Zr). For example, zirconium exists in the self-repairing layer 40 in a form of a Zr—O—Al crosslinked film layer with a network structure. The Zr—O—Al crosslinked film layer is a good corrosion-resistant layer, which can prevent the cathode layer from directly contacting with water vapor and oxygen.

In some embodiments, the self-repairing layer 40 may further include a polyaspartate, for example, sodium polyaspartate. The polyaspartate contributes to a formation of a crosslinked film layer. For example, the polyaspartate can form Zr—O bonds with Zr by a complexation reaction, and a cross-linking polymerization is occurred in a baking process by connecting the Zr—O bonds, to form a network structure, so that the transition metal in the self-repairing layer 40 can be uniformly distributed in the network structure.

In some embodiments, the self-repairing layer 40 may further include fluoroborate and borate. For example, the fluoroborate and the borate are added as catalysts for the reaction in the process of forming the self-repairing layer 40. The fluoroborate and the borate can accelerate a hydrolysis reaction, so that the reaction time of the hydrolysis reaction is shortened, and further the efficiency of forming the self-repairing layer 40 is increased.

In some embodiments, as shown in FIG. 1, the organic light-emitting diode device may further include a waterproof layer 50. The waterproof layer 50 is arranged on a side of the self-repairing layer 40 away from the cathode layer 30. The waterproof layer 50 can further ensure a waterproof effect and an anti-oxidation effect on the cathode layer. For example, the waterproof layer 50 contains perfluorosilane, so that the waterproof effect and the anti-oxidation effect can be better achieved.

In some embodiments, a thickness of the self-repairing layer may be from 0.5 μm to 1.0 μm, such as 0.6 μm, 0.7 μm, 0.8 μm, etc. In this situation, the thickness of the self-repairing layer is small, which causes no effect on an overall thickness of the device finally formed.

In some embodiments, a material of the cathode layer 30 includes aluminum or aluminum alloy, of course, other suitable materials may also be included, such as magnesium or magnesium alloys. Since the organic light-emitting diode device is provided with a self-repairing layer 40 capable of repairing the cathode layer 30, the material of the cathode layer is not limited to the commonly used magnesium aluminum alloy, etc., and any aluminum alloy material can be used, such as calcium aluminum alloy, etc., so that a selection range of the material of the cathode layer is broadened. For example, a material of the anode layer 10 includes a metal or a transparent metal oxide, such as ITO or IZO, and the material of the anode layer 10 is not limited in the embodiments of the present disclosure.

For example, as shown in FIG. 1, the organic light-emitting diode device further includes an encapsulation layer 60. For example, the organic light-emitting layer 20 further includes a hole injection layer 21, a hole transport layer 22, an organic light-emitting layer 23, and an electron transport layer 24. It should be noted that, the hole injection layer 21, the hole transport layer 22, the organic light-emitting layer 23, and the electron transport layer 24 in the organic light-emitting layer 20 can be selectively arranged according to actual conditions, for example, one or more of them are arranged, or none of them are arranged, and the specific structure of the organic light-emitting layer 20 is not limited in the embodiment of the present disclosure.

Figure 2:
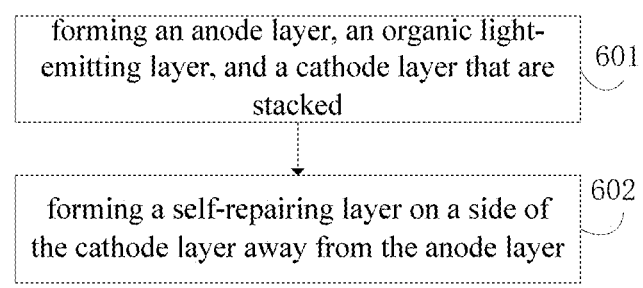
FIG. 2 is a first flowchart of a manufacturing method of an organic light-emitting diode device provided by an embodiment of the present disclosure.

At least one embodiment of the present disclosure further provides a manufacturing method of the organic light-emitting diode device, and electrodes of the organic light-emitting diode device formed by the manufacturing method have better performance. For example, FIG. 2 is a flowchart of a manufacturing method of an organic light-emitting diode device provided by an embodiment of the present disclosure, and the manufacturing method of the organic light-emitting diode device includes step 601 and step 602.

Step 601: forming an anode layer, an organic light-emitting layer, and a cathode layer that are stacked layer by layer.

For example, the anode layer and the cathode layer may be formed by a method such as a vacuum evaporation method or a vapor deposition method, and the organic light-emitting layer is formed by a method such as an inkjet printing method. For example, a material for forming the anode layer includes a metal or a transparent metal oxide, for example, ITO or IZO. A material for forming the cathode layer includes a metal material, such as aluminum or an aluminum alloy. For example, the anode layer and the cathode layer may be patterned by using a photolithography process. For example, a material of the organic light-emitting layer includes organic light-emitting materials that can emit light of different colors respectively, none of the material and the manufacturing method of each layer is specifically limited in the embodiments of the present disclosure.

Step 602: forming a self-repairing layer on a side of the cathode layer away from the anode layer.

In the present embodiment, the self-repairing layer is applicable for repairing the cathode layer by an oxidation-reduction reaction. For example, after the cathode layer is corroded by water vapor and oxygen, etc., the self-repairing layer can re-passivate a corroded cathode layer base by the oxidation-reduction reaction, so as to repair the corrosion points, increase a flatness of the cathode layer, and maintain a good stability of a surface of the cathode layer.

For example, the self-repairing layer comprises a transition metal acid salt with a highest valence; and forming the transition metal acid salt with the highest valence comprises: in-situ oxidizing the transition metal acid salt with a lower valence on the cathode layer to convert the transition metal acid salt with the lower valence into the transition metal acid salt with the highest valence.

Figure 3:
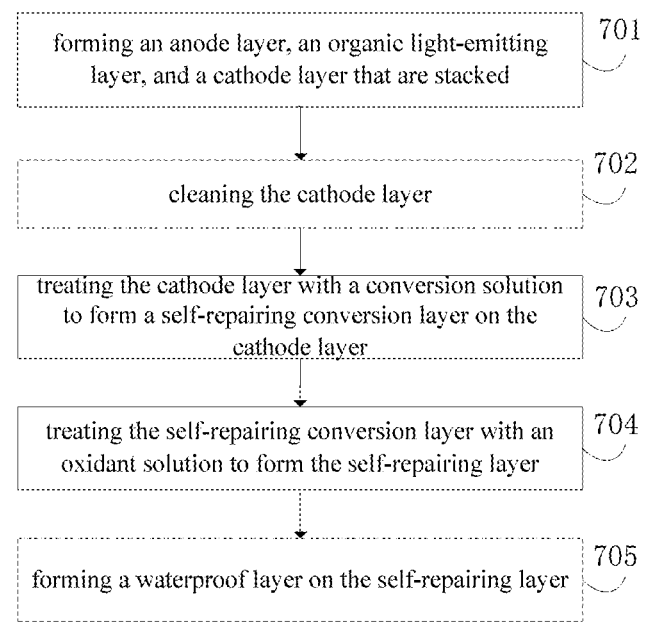
FIG. 3 is a second flowchart of a manufacturing method of an organic light-emitting diode device provided by an embodiment of the present disclosure.

For example, in an embodiment, as shown in FIG. 3, forming the self-repairing layer containing the transition metal acid salt with the highest valence in the organic light-emitting diode device may include step 701, step 703, and step 704.

Step 701: forming an anode layer, an organic light-emitting layer, and a cathode layer that are stacked layer by layer.

In the present embodiment, the materials and the methods for forming the anode layer, the organic light-emitting layer, and the cathode layer can refer to the above embodiments, which are omitted herein.

Step 703: treating the cathode layer with a conversion solution to form a self-repairing conversion layer on the cathode layer.

In the present embodiment, the conversion solution includes the transition metal acid salt with the lower valence. For example, a transition metal in the transition metal acid salt with the lower valence includes at least one selected from the group consisting of vanadium, manganese, and chromium, and accordingly, the conversion solution includes at least one selected from the group consisting of metavanadate, metachromate, and manganate. For example, treating the cathode layer with the conversion solution can be achieved by a method of spraying, that is, the conversion solution is sprayed on the cathode layer in a spray manner, so that the conversion solution reacts with the cathode layer.

Step 704: treating the self-repairing conversion layer with an oxidant solution to form the self-repairing layer.

In the present embodiment, the self-repairing conversion layer is treated with the oxidant solution, so that the transition metal acid salt with the lower valence is converted into the transition metal acid salt with the highest valence, and the self-repairing layer containing the transition metal acid salt with the highest valence is formed. For example, treating the self-repairing conversion layer with an oxidant solution can be achieved by a method of spraying, that is, the oxidant solution is sprayed on the self-repairing conversion layer in a spray manner, so that the oxidant solution reacts with the self-repairing conversion layer.

The manufacturing method of the organic light-emitting diode device provided by the present embodiment, can enhance a working stability of the cathode layer by forming the self-repairing layer containing the transition metal acid salt with the highest valence on the cathode layer, which effectively avoids problems such as electrode failure that may occur to the organic light-emitting diode device; furthermore, the luminous efficiency and the service life of the organic light-emitting diode device are improved.

It should be noted that, in the above embodiments, the process steps of forming the self-repairing layer on the cathode layer are mainly described, actually, the manufacturing method of the organic light-emitting diode device is not limited to the above steps, and may further include other process steps.

For example, in some embodiments, as shown in FIG. 3, the manufacturing method of the organic light-emitting diode device may further include step 702.

Step 702: cleaning the cathode layer.

For example, in the case that the formed cathode layer has impurities or the purity of the formed cathode layer is not high, the cathode layer may be cleaned to further improve the purity and the cleanliness of the cathode layer. In some cases, in the case where the purity and the cleanliness of the formed cathode layer itself have meet requirements, the step of cleaning the cathode layer may be omitted.

For example, in some embodiments, as shown in FIG. 3, the manufacturing method of the organic light-emitting diode device may further include step 705.

Step 705: forming a waterproof layer on the self-repairing layer.

In the present embodiment, the waterproof layer can further ensure the waterproof effect and the anti-oxidation effect of the cathode layer. For example, a hydrophobic treatment may be performed on the surface of the self-repairing layer with an organic substance to form the waterproof layer. For example, in an example, the self-repairing layer is treated with a solution containing perfluorosilane to form the waterproof layer.

In the following, the formation of the self-repairing layer containing an acid salt with the highest valence of vanadium (V) in the organic light-emitting diode device is taken as an example to specifically introduce the manufacturing method of the organic light-emitting diode device.

Figure 4:
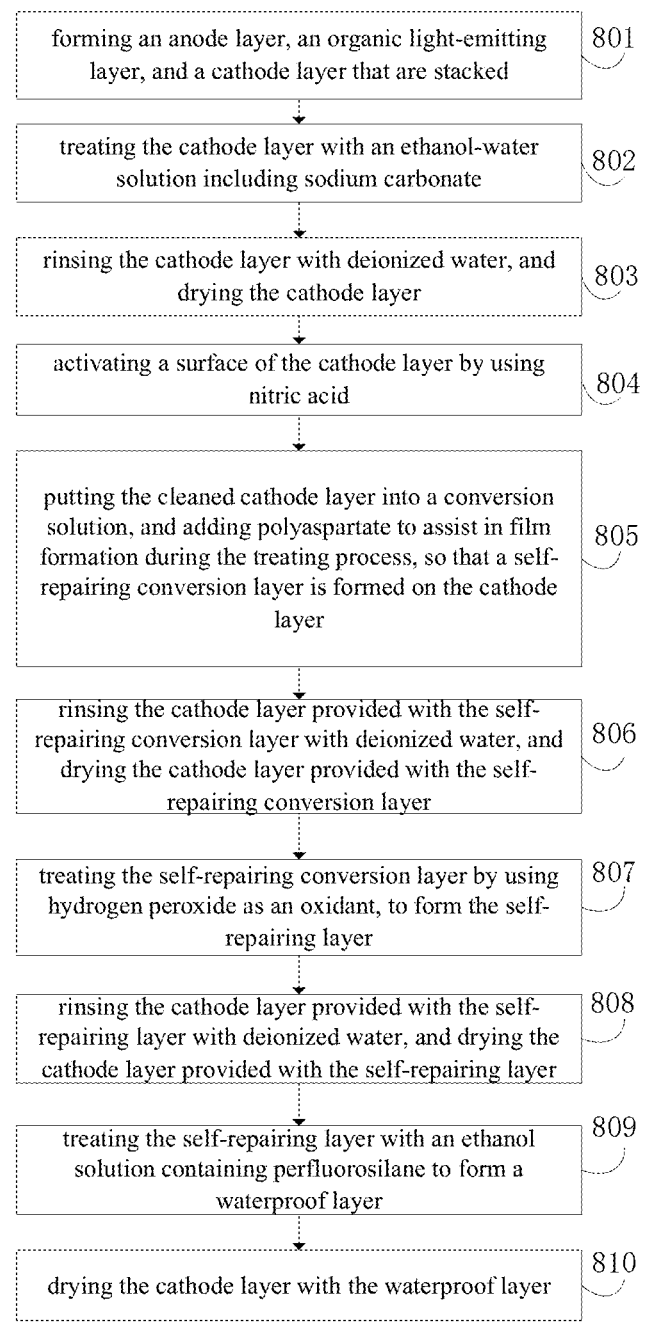
FIG. 4 is a third flowchart of a manufacturing method of an organic light-emitting diode device provided by an embodiment of the present disclosure.

As shown in FIG. 4, the manufacturing method of the organic light-emitting diode device in the example includes step 801 to step 810.

Step 801: forming an anode layer, an organic light-emitting layer, and a cathode layer that are stacked layer by layer.

For example, the anode layer and the cathode layer may be formed by a method such as a vacuum evaporation method or a vapor deposition method, and the organic light-emitting layer is formed by a method such as an inkjet printing method. For example, a material for forming the anode layer includes a metal or a transparent metal oxide, for example, ITO or IZO. A material for forming the cathode layer includes a metal material, such as aluminum or an aluminum alloy. For example, the anode layer and the cathode layer may be patterned by using a photolithography process. For example, a material of the organic light-emitting layer includes organic light-emitting materials that can emit light of different colors respectively; both the material and the manufacturing method of each layer are not specifically limited in the embodiment of the present disclosure.

Step 802: treating the cathode layer with an ethanol-water solution including sodium carbonate.

Treating the cathode layer with the ethanol-water solution including sodium carbonate can remove the impurities that may exist in the cathode layer. For example, in the ethanol-water solution including the sodium carbonate, a volume ratio of the ethanol to the water is from 1:4 to 1:3, and a mass concentration of the sodium carbonate is from 8 g/L to 10 g/L. For example, the treating method is ultrasonic cleaning, the treating time is from 3 minutes to 5 minutes, and the treating temperature is from 23° C. to 30° C. For example, the cathode layer is immersed in the ethanol-water solution including the sodium carbonate ($Na_2CO_3$), so that the ethanol-water solution including the sodium carbonate can better treat the cathode layer, and a better effect of ultrasonic cleaning is achieved.

Step 803: rinsing the cathode layer with deionized water, and drying the cathode layer.

After the step of treating the cathode layer with the ethanol-water solution including the sodium carbonate is completed, the cathode layer is rinsed with deionized water, and then the cathode layer is dried. For example, the time for drying the cathode layer is from 2 minutes to 3 minutes, and the temperature for drying the cathode layer is from 100° C. to 110° C. For example, the process of drying the cathode layer may use a blast drying oven; or in some cases, the cathode layer is dried at a room temperature.

Step 804: performing an activating treatment on a surface of the cathode layer by using nitric acid ($HNO_3$).

The step of activating the surface of the cathode layer by using the nitric acid ($HNO_3$) can make the surface of the cathode layer have a higher reactive activation, which is beneficial to form the self-repairing layer on the surface of the cathode layer later. For example, a mass fraction of the nitric acid used for activating the surface of the cathode layer is from 10% to 15%.

Step 805: putting the cleaned cathode layer into a conversion solution, and adding polyaspartate to assist in film formation in the process, so that a self-repairing conversion layer is formed on the cathode layer.

Putting the cleaned cathode layer into the conversion solution can make the cathode layer fully contact with the conversion solution. For example, a method of water bath for heat preservation is used to ensure that the temperature of the conversion solution during the process of treating the cathode layer is from 20° C. to 30° C., and the time of treating the cathode layer is from 5 min to 8 min. For example, the polyaspartate is added to the surface of the cathode layer during the treating process. For example, the sodium polyaspartate assists in forming the film, thereby forming the self-repairing conversion layer on the cathode layer. For example, a mass concentration of the added sodium polyaspartate is from 0.4 g/L to 1 g/L. For example, in the example, the conversion solution comprises: fluoboric acid with a mass concentration of 0.2 g/L to 0.4 g/L, potassium fluozirconate with a mass concentration of 1.5 g/L to 3 g/L, boric acid with a mass concentration of 0.2 g/L to 0.4 g/L, and sodium metavanadate with a mass concentration of 3 g/L to 5 g/L, and a pH of the conversion solution is adjusted from 4.0 to 5.0 by ammonia and nitric acid.

In the example, the potassium fluozirconate is a main salt for forming the film, and serves as a source of zirconium (Zr) in a hydrolysis process to form a Zr—O—Al crosslinked film layer. The sodium metavanadate, as a raw material of high-valent vanadium (V), can be uniformly distributed in the network structure of the crosslinked film layer under the action of the polyaspartate in the case that the pH of the conversion solution is increased. The polyaspartate has a polyhydroxy structure, for example, the polyaspartate can complex and chelate with aluminum alloy on the surface of the cathode layer to change a deposition pattern of the potassium fluozirconate, so that a binding force between active ingredients is improved, and finally a tightly structured organic-inorganic cross-linked network structure is formed. In addition, the polyaspartate is also a good corrosion inhibitor, which has an anti-corrosive effect on the aluminum alloy, and the polyaspartate can also be used for corrosion protection of steel, copper and a copper alloy. The boric acid is weakly acidic in water solution and can be used as a catalyst for the reaction, the boric acid is also known as a promoter, and the boric acid can accelerate the hydrolysis reaction and shorten the time of the hydrolysis reaction. Both the fluoroboric acid and the boric acid act as a promoter, which show strong acidity and can adjust the pH, or both the fluoroboric acid and the boric acid act as a buffer to maintain a stability of the pH of the solution.

Step 806: rinsing the cathode layer formed with the self-repairing conversion layer with deionized water, and drying the cathode layer formed with the self-repairing conversion layer.

For example, the time of drying the cathode layer formed with the self-repairing conversion layer is from 10 minutes to 15 minutes, and the temperature of drying the cathode layer formed with the self-repairing conversion layer is from 100° C. to 110° C. For example, the process of drying the cathode layer formed with the self-repairing conversion layer may use a blast drying oven; or in some cases, the cathode layer formed with the self-repairing conversion layer is dried at a room temperature.

The self-repairing conversion layer obtained in the example includes an organic-inorganic composite network film layer, in which the Zr—O—Al crosslinked film layer can play a role of corrosion-resistant protection, and the highest valence of vanadium V which is uniformly distributed can play a role of repairing and filling. Both principles of forming the Zr—O—Al crosslinked film layer and forming the highest valence of vanadium V are described as follows.

Forming the Zr—O—Al crosslinked film layer (a corrosion-resistant layer): the cathode layer, for example, an aluminum alloy base forms a galvanic cell with the fluozirconate in the conversion solution in the process of being treated with the conversion solution, and a hydrogen evolution reaction or an oxygen absorption reaction happens, which causes a local pH increase in the conversion solution, and $Zr(OH)_4$ and $Al(OH)_3$ are formed in the local environment through a hydrolysis reaction. The two kinds of hydroxides $Zr(OH)_4$ and $Al(OH)_3$ are dehydrated into bonds under a high temperature baking to form the Zr—O—Al crosslinked film layer. The crosslinked film layer is a good corrosion-resistant layer, which can prevent the cathode layer from directly contacting with water vapor and oxygen, etc.

Forming a network structure of the high valence vanadium V (a repairing layer): the sodium polyaspartate added during the manufacturing process can be adsorbed on the cathode layer such as the aluminum alloy base, and a complex reaction happens between the sodium polyaspartate and the fluozirconate, so that a complex reaction happens between the sodium polyaspartate and Zr to generate Zr—O bonds, and in the baking process, cross-linking polymerization occurs by connecting the Zr—O bonds to form the network structure. Meanwhile, in the process that the local pH in the solution is increased, the vanadium V in the solution mostly exists in a form of a composite oxide, such as $VO(OH)_3$, $VO_2(OH)_2$, etc., and the vanadium V is uniformly distributed in the network structure because of the existence of the sodium polyaspartate.

Step 807: treating the self-repairing conversion layer by using hydrogen peroxide as an oxidant, to form the self-repairing layer.

Treating the self-repairing conversion layer with the hydrogen peroxide as the oxidant solution allows that the transition metal acid salt with the lower valence to be converted into the transition metal acid salt with the highest valence, which ensures that the valence of the vanadium in the self-repairing conversion layer converts to the highest valence, thereby forming the self-repairing layer. For example, a mass concentration of the used hydrogen peroxide is from 1.5 g/L to 6 g/L, and the pH of the hydrogen peroxide is from 5.0 to 6.0. For example, in the process of treating the self-repairing conversion layer, the self-repairing conversion layer can be immersed in the hydrogen peroxide, the time for immersing the self-repairing conversion layer is from 2 minutes to 4 minutes, and the temperature for immersing the self-repairing conversion layer is from 23° C. to 30° C.

After the above processing, all the vanadium V exists in the structure of the self-repairing layer in the form of the highest valence, and a construction of a network oxide film system is realized. In a case that, the cathode layer, for example, an aluminum alloy material under the self-repairing layer is corroded by water vapor and oxygen, etc., because the equilibrium system is damaged, the high valence vanadium V can enter the microporous defects through the corrosive medium to polymerize and form the secondary protection, the cathode layer base is re-passivated by the oxidation-reduction reaction, the corrosion points are repaired, the flatness of the cathode layer is increased, and the good stability of the surface of the cathode layer is maintained.

Step 808: rinsing the cathode layer formed with the self-repairing layer with deionized water, and drying the cathode layer formed with the self-repairing layer.

For example, the time of drying the cathode layer formed with the self-repairing layer is from 10 minutes to 15 minutes, and the temperature of drying the cathode layer formed with the self-repairing layer is from 100° C. to 110° C. For example, the process of drying the cathode layer formed with the self-repairing layer may use a blast drying oven; or in some cases, the cathode layer formed with the self-repairing layer is dried at a room temperature.

In the self-repairing layer obtained in the step, both the two effective structures, the Zr—O—Al crosslinked film layer and the high valence vanadium V network structure, are uniformly distributed in order in the network structure of the self-repairing layer. The combination of the two effective structures can not only effectively prevent corrosion, but also achieve repairing after corrosion, double protection effect is achieved, and thus the service life of the organic light-emitting diode can be effectively improved.

Step 809: treating the self-repairing layer with an ethanol solution containing perfluorosilane to form a waterproof layer.

In the step, by performing a hydrophobic treatment on a trace amount of organic matter on the surface of the self-repairing layer, the waterproof layer can be formed on the self-repairing layer, to further ensure the waterproof effect and the anti-oxidation effect on the cathode layer, such as an aluminum alloy cathode. For example, the hydrophobic treatment may use a solution containing perfluorosilane, for example, using the ethanol solution containing the perfluorosilane. For example, the cathode layer provided with the self-repairing layer is immersed in the ethanol solution containing the perfluorosilane (PFAS), and thus the waterproof layer is formed on the surface of the self-repairing layer. For example, in the ethanol solution containing the perfluorosilane, a mass fraction of the perfluorosilane is from 0.1% to 10%, for example, 1%. The time for treating the self-repairing layer by using the ethanol solution containing the perfluorosilane is from 1 h to 2 h, and the temperature for treating the self-repairing layer is from 20° C. to 40° C.

Step 810: drying the cathode layer provided with the waterproof layer.

For example, in the step, the time of drying the cathode layer provided with the waterproof layer is from 5 minutes to 8 minutes, and the temperature of drying the cathode layer provided with the waterproof layer is from 80° C. to 90° C. For example, the process of drying the cathode layer provided with the waterproof layer may use a blast drying oven; or in some cases, the cathode layer provided with the waterproof layer is dried at a room temperature. Finally, the organic light-emitting diode device provided with both the self-repairing layer and the waterproof layer is obtained.

The manufacturing method of the organic light-emitting diode device provided by the embodiment of the present disclosure, can enhance a working stability of the cathode layer by forming the self-repairing layer containing the transition metal acid salt with the highest valence on the cathode layer, which effectively avoids problems such as electrode failure that may occur in the organic light-emitting diode device, furthermore, the luminous efficiency and the service life of the organic light-emitting diode device are improved. For example, in the manufacturing method of the organic light-emitting diode device provided by the embodiment of the present disclosure, the self-repairing layer is obtained by treating with the conversion solution, which enhances the working stability of the cathode layer such as an aluminum alloy cathode. In some embodiments, the waterproof layer is further formed on the self-repairing layer, which further ensures the waterproof effect and the anti-oxidation effect of the aluminum alloy cathode. Compared with other organic light-emitting diode devices that use a multilayer structure film or an encapsulation film to achieve the waterproof effect, the manufacturing method of the organic light-emitting diode device provided by the embodiment of the present disclosure achieves the waterproof effect and at the same time realizes the stability of the aluminum alloy cathode with maintaining a small overall thickness of the organic light-emitting diode.

A chemical testing and a surface element analysis is performed on the self-repairing layer (the self-repairing layer includes the vanadium V with the highest valence) of the organic light-emitting diode device obtained by using the manufacturing method of the embodiment of the present disclosure, and the test results are shown in Table 1 to Table 3.

TABLE 1

Electrochemical corrosion test results in NaCl solution with a mass percentage of 3%

| Sample | Electrochemical corrosion potential (V) | Electrochemical corrosion current ($\mu A/cm^2$) |
|---|---|---|
| Normal zirconium conversion layer | −1.76 | 0.745 |
| Self-repairing layer provided by the present disclosure | −0.52 | 0.011 |

It can be seen from Table 1, compared with the normal zirconium conversion layer formed on the cathode layer, the electrochemical corrosion potential of the self-repairing layer provided by the embodiment of the present disclosure is significantly reduced, and the corresponding electrochemical corrosion current is also reduced, which means that the self-repairing layer provided by the embodiment of the present disclosure can effectively achieve the anti-corrosive effect on the cathode layer, for example, the aluminum alloy cathode used in the test.

TABLE 2

Electrochemical impedance test results

| Sample | Surface layer capacitance (F · cm$^{-2}$) | Surface layer resistance (Ω · cm$^{-2}$) | Diffusion layer resistance (Ω · cm$^{-2}$) |
| --- | --- | --- | --- |
| Normal zirconium conversion layer | 1.87 * 10$^{-7}$ | 2.45 * 10$^3$ | 3.48 * 10$^{-4}$ |
| Self-repairing layer provided by the present disclosure | 2.06 * 10$^{-6}$ | 9.84 * 10$^3$ | 1.97 * 10$^{-3}$ |

It can be seen from Table 2, compared with the normal zirconium conversion layer formed on the cathode layer, the values of both the impedance and the surface layer capacitance of the self-repairing layer provided by the embodiment of the present disclosure are significantly improved, which means that the corrosion resistance of the self-repairing layer provided by the embodiment of the present disclosure is significantly increased; in addition, the increase of the surface layer capacitance indicates that the self-repairing layer provided by the embodiment of the present disclosure has more grains, which means that in the self-repairing layer, for example, the polyaspartate forms a good network structure.

TABLE 3

Surface element analysis of the self-repairing layer provided by the present disclosure after accelerating corrosion by brine

| Main element | Unprocessed | 2nd day | 4th day | 6th day |
| --- | --- | --- | --- | --- |
| Al | 85.62 | 70.14 | 69.52 | 68.05 |
| V | 7.52 | 10.87 | 14.54 | 15.13 |

Figure 7A:
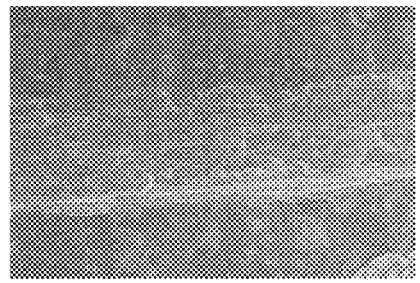
FIG. 7a and FIG. 7b are images of the surface, under the microscope, of the cathode layer of the organic light-emitting diode before and after the self-repairing layer is formed respectively provided by an embodiment of the present disclosure.
Figure 7B:
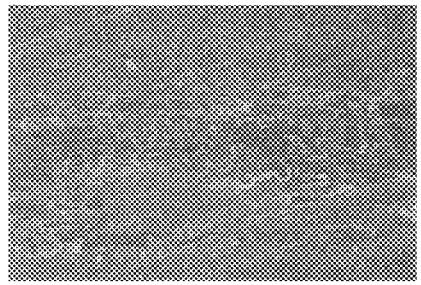

The surface elements of the self-repairing layer provided in the embodiment of the present disclosure are analyzed, and it can be seen from Table 3, in the process of accelerating corrosion, the content of the Al element decreased significantly at first and then tended to be stable; the content of the V element was gradually increased and then tended to be stable. On the second day, Al was corroded seriously; on the fourth day, the corrosion process of Al gradually decreased with the increase of V element, and finally the Al corrosion basically stopped. It can be seen that the increase of V element has obvious self-repairing effect and anti-corrosion effect on Al. Combining FIG. 7a and FIG. 7b, it can be seen that the flatness of the defect points is significantly improved, and it can be seen that V plays a good self-repairing role. At the same time, the above change trend obtained by the test is consistent with a self-repairing principle of the self-repairing layer.

V (vanadium), which is a self-repairing active ingredient of the self-repairing layer in the embodiment of the present disclosure, is a transition metal element, and the position of the V (vanadium) in the element periodic table is VB family and in the fourth period, in a case that V is in a high valence, V has a strong oxidation ability and can oxidize the cathode layer such as the aluminum alloy cathode, and the effect of repairing the defect points is achieved. Similarly, for example, the elements Cr (chromium) and Mn (manganese) in the fourth period and immediately adjacent to V (vanadium) in the element periodic table have similar chemical properties as V (vanadium). The manufacturing method of the organic light-emitting diode device provided by the embodiment of the present disclosure is specifically described as follows by taking the self-repairing layer containing the Cr (chrome) or the Mn (manganese) with the highest valence as an example.

Figure 5:
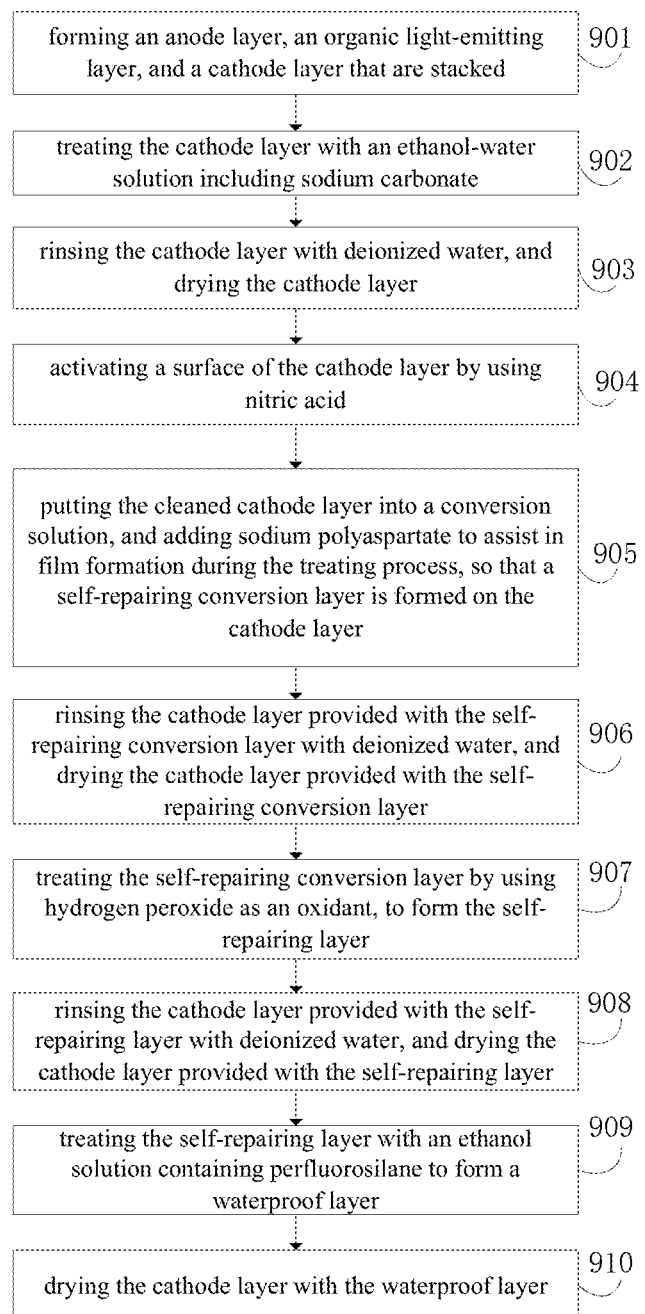
FIG. 5 is a fourth flowchart of a manufacturing method of an organic light-emitting diode device provided by an embodiment of the present disclosure.

As shown in FIG. 5, the manufacturing method of the organic light-emitting diode device provided by the embodiment of the present disclosure includes step 901 to step 910. The manufacturing method can manufacture the organic light-emitting diode device with the self-repairing layer which contains the Cr (chromium) with the highest valence.

Step 901: forming an anode layer, an organic light-emitting layer, and a cathode layer that are stacked layer by layer.

For example, the anode layer and the cathode layer may be formed by a method such as a vacuum evaporation method or a vapor deposition method, and the organic light-emitting layer is formed by a method such as an inkjet printing method. For example, a material for forming the anode layer includes a metal or a transparent metal oxide, for example ITO. A material for forming the cathode layer includes a metal material, such as an aluminum alloy. For example, the anode layer and the cathode layer may be patterned by using a photolithography process. For example, a material of the organic light-emitting layer includes organic light-emitting materials that can emit light of different colors respectively, none of the material and the manufacturing method of each layer is specifically limited in the embodiment of the present disclosure.

Step 902: treating the cathode layer with an ethanol-water solution including sodium carbonate.

For example, in the ethanol-water solution including the sodium carbonate, a volume ratio of the ethanol to the water is from 1:4 to 1:3, and a mass concentration of the sodium carbonate is from 8 g/L to 10 g/L. For example, the treating method is ultrasonic cleaning, the treating time is from 3 minutes to 5 minutes, and the treating temperature is from 23° C. to 30° C. For example, the cathode layer is immersed in the ethanol-water solution including the sodium carbonate (Na$_2$CO$_3$), so that the ethanol-water solution including the sodium carbonate can better treat the cathode layer.

Step 903: rinsing the cathode layer with deionized water, and drying the cathode layer.

For example, the time of drying the cathode layer is from 2 minutes to 3 minutes, and the temperature of drying the cathode layer is from 100° C. to 110° C. For example, the process of drying the cathode layer may use a blast drying oven; or in some cases, the cathode layer is dried at a room temperature.

Step 904: activating a surface of the cathode layer by using nitric acid (HNO$_3$).

For example, a mass fraction of the nitric acid used for activating the surface of the cathode layer is from 10% to 15%.

Step 905: putting the cleaned cathode layer into a conversion solution, and adding sodium polyaspartate to assist in film formation in the process, so that a self-repairing conversion layer is formed on the cathode layer.

For example, a method of water bath for heat preservation is used to ensure that the temperature of the conversion solution during the process of treating the cathode layer is from 20° C. to 30° C., and the time of treating the cathode layer is from 5 min to 8 min. For example, the sodium polyaspartate is added to the surface of the cathode layer during the treating process to assist in forming the film, thereby forming the self-repairing conversion layer on the cathode layer. For example, a mass concentration of the added sodium polyaspartate is from 0.4 g/L to 1 g/L. For example, the conversion solution comprises: fluoboric acid with a mass concentration of 0.2 g/L to 0.4 g/L, potassium fluozirconate with a mass concentration of 1.5 g/L to 3 g/L, boric acid with a mass concentration of 0.2 g/L to 0.4 g/L, and potassium dichromate with a mass concentration of 2.4 g/L to 4 g/L, and a pH of the conversion solution is adjusted from 4.0 to 5.0 by ammonia and nitric acid.

In the example, the potassium fluorozirconate is a main salt for forming the film, and serves as a source of zirconium (Zr) in a hydrolysis process to form a Zr—O—Al crosslinked film layer. The potassium dichromate, as a raw material of high-valent chromium (Cr), can be uniformly distributed in the network structure of the crosslinked film layer under the action of the sodium polyaspartate in the case that the pH of the conversion solution is increased. The sodium polyaspartate has a polyhydroxy structure, for example, complexation and chelation can occur on the surface of the cathode layer made of the aluminum alloy to change a deposition pattern of the potassium fluozirconate, so that a binding force between active ingredients is improved, and finally a tightly structured organic-inorganic cross-linked network structure is formed. In addition, the sodium polyaspartate is also a good corrosion inhibitor, which has an anti-corrosive effect on the aluminum alloy, and the sodium polyaspartate can also be used for corrosion protection of steel, copper and a copper alloy. The boric acid is weakly acidic in water solution and can be used as a catalyst for the reaction, the boric acid is also known as a promoter, and the boric acid can accelerate the hydrolysis reaction and shorten the time of the hydrolysis reaction. Both the fluoroboric acid and the boric acid act as a promoter, which show strong acidity and adjust the pH, or both the fluoroboric acid and the boric acid act as a buffer to maintain a stability of the pH of the solution.

Step 906: rinsing the cathode layer provided with the self-repairing conversion layer with deionized water, and drying the cathode layer provided with the self-repairing conversion layer.

For example, the time of drying the cathode layer provided with the self-repairing conversion layer is from 10 minutes to 15 minutes, and the temperature of drying the cathode layer provided with the self-repairing conversion layer is from 100° C. to 110° C. For example, the process of drying the cathode layer provided with the self-repairing conversion layer may use a blast drying oven; or in some cases, the cathode layer provided with the self-repairing conversion layer is dried at a room temperature.

The self-repairing conversion layer obtained in the example includes an organic-inorganic composite network film layer, in which the Zr—O—Al crosslinked film layer can play a role of corrosion-resistant protection, the highest valence of chromium Cr which is uniformly distributed can play a role of repairing and filling. Both principles of forming the Zr—O—Al crosslinked film layer and forming the highest valence of chromium Cr are described as follows.

Forming the Zr—O—Al crosslinked film layer (a corrosion-resistant layer): the cathode layer, for example, an aluminum alloy base forms a galvanic cell with the fluorozirconate in the conversion solution in the process of being treating with the conversion solution, and a hydrogen evolution reaction or an oxygen absorption reaction happens, which causes a local pH increase in the conversion solution, and $Zr(OH)_4$ and $Al(OH)_3$ are formed in the local environment through a hydrolysis reaction. The two kinds of hydroxides $Zr(OH)_4$ and $Al(OH)_3$ are dehydrated into bonds under high temperature baking to form the Zr—O—Al crosslinked film layer. The crosslinked film layer is a good corrosion-resistant layer, which can prevent the cathode layer from directly contacting with water vapor and oxygen, etc.

Forming a network structure of the high valence chromium Cr (a repairing layer): the sodium polyaspartate added during the manufacturing process can be adsorbed on the cathode layer such as the aluminum alloy base, and a complex reaction happens between the sodium polyaspartate and the fluozirconate, so that a complex reaction happens between the sodium polyaspartate and Zr to generate Zr—O bonds, and in the baking process, cross-linking polymerization occurs by connecting the Zr—O bonds to form the network structure. At the same time, in the process that the local pH in the solution is increased, the chromium Cr is uniformly distributed in the network structure because of the existence of the sodium polyaspartate.

Step 907: treating the self-repairing conversion layer by using hydrogen peroxide as an oxidant, to form the self-repairing layer.

Treating the self-repairing conversion layer with the hydrogen peroxide as the oxidant solution allows that the transition metal acid salt with the lower valence to be converted into the transition metal acid salt with the highest valence, which ensures that the valence of the Cr in the self-repairing conversion layer converts to the highest valence, thereby forming the self-repairing layer. For example, a mass concentration of the used hydrogen peroxide is from 0.5 g/L to 2 g/L, and the pH of the hydrogen peroxide is from 8.5 to 10 (weakly alkaline). For example, the self-repairing conversion layer can be immersed in the hydrogen peroxide, the time for immersing the self-repairing conversion layer is from 2 minutes to 4 minutes, and the temperature for immersing the self-repairing conversion layer is from 23° C. to 30° C.

After the above processing, all the Cr exists in the structure of the self-repairing layer in the form of the highest valence, and a construction of a network oxide film system is realized. In a case that, the cathode layer, for example, the aluminum alloy under the self-repairing layer is corroded by water vapor and oxygen, etc., because the equilibrium system is damaged, the high valence Cr can enter the microporous defects through the corrosive medium to polymerize and form the secondary protection, the cathode layer base is re-passivated by the oxidation-reduction reaction, the corrosion points are repaired, the flatness of the cathode layer is increased, and the good stability of the surface of the cathode layer is maintained.

Step 908: rinsing the cathode layer provided with the self-repairing layer with deionized water, and drying the cathode layer provided with the self-repairing layer.

For example, the time of drying the cathode layer provided with the self-repairing layer is from 10 minutes to 15 minutes, and the temperature of drying the cathode layer provided with the self-repairing layer is from 100° C. to 110° C. For example, the process of drying the cathode layer provided with the self-repairing layer may use a blast drying oven; or in some cases, the cathode layer provided with the self-repairing layer is dried at a room temperature.

In the self-repairing layer obtained in the step, both the two effective structures, the Zr—O—Al crosslinked film layer and the high valence Cr network structure, are uniformly distributed in order in the network structure of the self-repairing layer. The combination of the two effective structures can not only effectively prevent corrosion, but also achieve repairing after corrosion, double protection effect is achieved, and thus the service life of the organic light-emitting diode can be effectively improved.

Step 909: treating the self-repairing layer with an ethanol solution containing perfluorosilane to form a waterproof layer.

In the example, by performing a hydrophobic treatment on a trace amount of organic matter on the surface of the self-repairing layer, the waterproof layer can be formed on the self-repairing layer, to further ensure the waterproof effect and the anti-oxidation effect on the cathode layer, such as an aluminum alloy cathode. For example, the cathode layer provided with the self-repairing layer is immersed in the ethanol solution containing the perfluorosilane (PFAS) to form the waterproof layer. For example, in the ethanol solution containing the perfluorosilane, a mass fraction of the perfluorosilane is from 0.1% to 10%, for example, 1%. The time for treating the self-repairing layer by using the ethanol solution containing the perfluorosilane is from 1 h to 2 h, and the temperature for treating the self-repairing layer is from 20° C. to 40° C.

Step 910: drying the cathode layer provided with the waterproof layer.

For example, the time of drying the cathode layer provided with the waterproof layer is from 5 minutes to 8 minutes, and the temperature of drying the cathode layer provided with the waterproof layer is from 80° C. to 90° C. For example, the process of drying the cathode layer provided with the waterproof layer may use a blast drying oven; or in some cases, the cathode layer provided with the waterproof layer is dried at a room temperature.

The manufacturing method of the organic light-emitting diode device provided by the embodiment of the present disclosure, can enhance a working stability of the cathode layer by forming the self-repairing layer containing the transition metal acid salt with the highest valence on the cathode layer, which effectively avoids problems such as electrode failure that may occur in the organic light-emitting diode device, furthermore, the luminous efficiency and the service life of the organic light-emitting diode device are improved. For example, in the manufacturing method of the organic light-emitting diode device provided by the embodiment of the present disclosure, the self-repairing layer is obtained by treating with the conversion solution, which enhances the working stability of the cathode layer such as the aluminum alloy cathode. In some embodiments, the waterproof layer is further formed on the self-repairing layer, which further ensures the waterproof effect and the anti-oxidation effect of the aluminum alloy cathode. Compared with other organic light-emitting diode devices that use a multilayer structure film or an encapsulation film to achieve the waterproof effect, the manufacturing method of the organic light-emitting diode device provided by the embodiment of the present disclosure achieves the waterproof effect and at the same time realizes the stability of the aluminum alloy cathode with maintaining a small overall thickness of the organic light-emitting diode.

Figure 6:
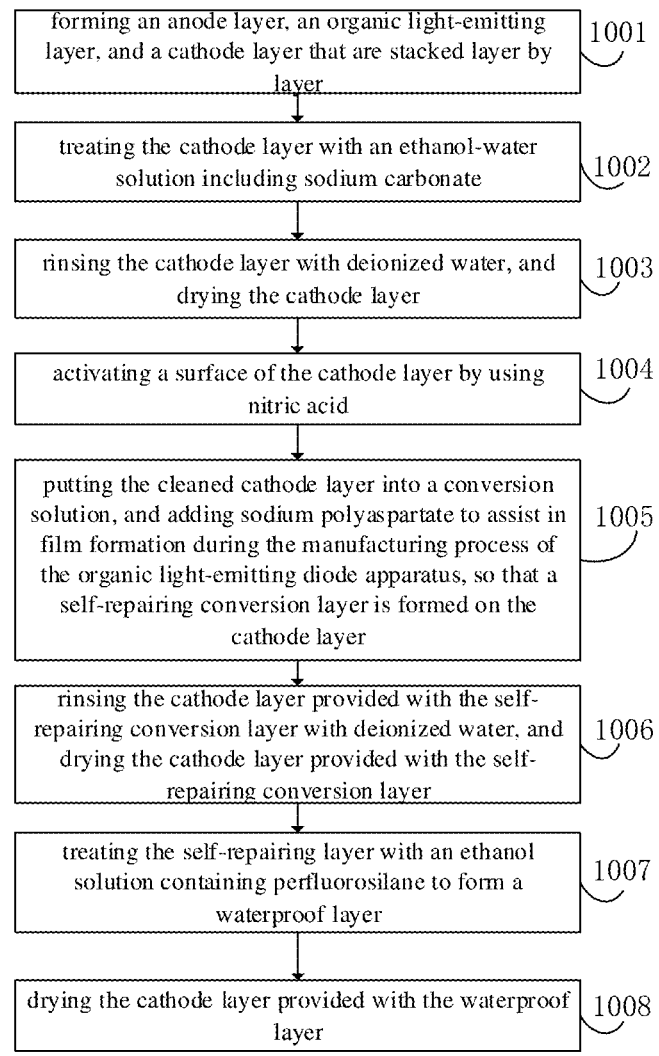
FIG. 6 is a fifth flowchart of a manufacturing method of an organic light-emitting diode device provided by an embodiment of the present disclosure.

As shown in FIG. 6, the manufacturing method of the organic light-emitting diode device provided by another embodiment of the present disclosure may include step 1001 to step 1008. The manufacturing method can manufacture the organic light-emitting diode device with the self-repairing layer which contains the highest valence Mn (manganese).

Step 1001: forming an anode layer, an organic light-emitting layer, and a cathode layer that are stacked layer by layer.

For example, the anode layer and the cathode layer may be formed by a method such as a vacuum evaporation method or a vapor deposition method, and the organic light-emitting layer is formed by a method such as an inkjet printing method. For example, a material for forming the anode layer includes a metal or a transparent metal oxide, for example IZO. A material for forming the cathode layer includes a metal material, such as an aluminum alloy. For example, the anode layer and the cathode layer may be patterned by using a photolithography process. For example, a material of the organic light-emitting layer includes organic light-emitting materials that can emit light of different colors respectively, none of the material and the manufacturing method of each layer is not specifically limited in the embodiment of the present disclosure.

Step 1002: treating the cathode layer with an ethanol-water solution including sodium carbonate.

For example, in the ethanol-water solution including the sodium carbonate ($Na_2CO_3$), a volume ratio of the ethanol to the water is from 1:4 to 1:3, and a mass concentration of the sodium carbonate is from 8 g/L to 10 g/L. For example, the treating method is ultrasonic cleaning, the treating time is from 3 minutes to 5 minutes, and the treating temperature is from 23° C. to 30° C. For example, the cathode layer is immersed in the ethanol-water solution including the sodium carbonate ($Na_2CO_3$), so that the ethanol-water solution including the sodium carbonate can better treat the cathode layer.

Step 1003: rinsing the cathode layer with deionized water, and drying the cathode layer.

For example, the time of drying the cathode layer is from 2 minutes to 3 minutes, and the temperature of drying the cathode layer is from 100° C. to 110° C. For example, the process of drying the cathode layer may use a blast drying oven; or in some cases, the cathode layer is dried at a room temperature.

Step 1004: activating a surface of the cathode layer by using nitric acid ($HNO_3$).

For example, a mass fraction of the nitric acid used for activating the surface of the cathode layer is from 10% to 15%.

Step 1005: putting the cleaned cathode layer into a conversion solution, and adding sodium polyaspartate to assist in film formation during the manufacturing process of the organic light-emitting diode device, so that a self-repairing conversion layer is formed on the cathode layer.

For example, a method of water bath for heat preservation is used to ensure that the temperature of the conversion solution during the process of treating the cathode layer is from 20° C. to 30° C., and the time of treating the cathode layer is from 5 min to 8 min. For example, the sodium polyaspartate is added to the surface of the cathode layer during the manufacturing process to assist in forming the film, thereby forming the self-repairing conversion layer on the cathode layer. For example, a mass concentration of the added sodium polyaspartate is from 0.4 g/L to 1 g/L. For example, the conversion solution comprises: fluoboric acid with a mass concentration of 0.2 g/L to 0.4 g/L, potassium fluozirconate with a mass concentration of 1.5 g/L to 3 g/L, boric acid with a mass concentration of 0.2 g/L to 0.4 g/L, and potassium permanganate with a mass concentration of 2.6 g/L to 4.3 g/L, and a pH of the conversion solution is adjusted from 4.0 to 5.0 by ammonia and nitric acid.

In the example, the potassium fluorozirconate is a main salt for forming the film, and serves as a source of zirconium (Zr) in a hydrolysis process to form a Zr—O—Al cross-linked film layer. The potassium permanganate, as a raw material of high-valent manganese (Mn), can be uniformly distributed in the network structure of the crosslinked film layer under the action of the sodium polyaspartate in the case that the pH of the conversion solution is increased. The sodium polyaspartate has a polyhydroxy structure, for example, complexation and chelation can occur on the surface of the cathode layer made of the aluminum alloy to change a deposition pattern of the potassium fluozirconate, so that a binding force between active ingredients is improved, and finally a tightly structured organic-inorganic cross-linked network structure is formed. In addition, the sodium polyaspartate is also a good corrosion inhibitor, which has an anti-corrosive effect on the aluminum alloy, and the sodium polyaspartate can also be used for corrosion protection of steel, copper and a copper alloy. The boric acid is weakly acidic in water solution and can be used as a catalyst for the reaction, the boric acid is also known as a promoter, and the boric acid can accelerate the hydrolysis reaction and shorten the time of the hydrolysis reaction. Both the fluoroboric acid and the boric acid act as a promoter, which show strong acidity and adjust the pH, or both the fluoroboric acid and the boric acid act as a buffer to maintain a stability of the pH of the solution.

Step 1006: rinsing the cathode layer provided with the self-repairing conversion layer with deionized water, and drying the cathode layer provided with the self-repairing conversion layer.

For example, the time of drying the cathode layer provided with the self-repairing conversion layer is from 10 minutes to 15 minutes, and the temperature of drying the cathode layer provided with the self-repairing conversion layer is from 100° C. to 110° C. For example, the process of drying the cathode layer provided with the self-repairing conversion layer may use a blast drying oven; or in some cases, the cathode layer provided with the self-repairing conversion layer is dried at a room temperature.

The self-repairing conversion layer obtained in the example includes an organic-inorganic composite network film layer, in which the Zr—O—Al crosslinked film layer can play a role of corrosion-resistant protection, the highest valence of manganese (Mn) which is uniformly distributed can play a role of repairing and filling. Both principles of forming the Zr—O—Al crosslinked film layer and forming the highest valence of manganese (Mn) are described as follows.

Forming the Zr—O—Al crosslinked film layer (a corrosion-resistant layer): the cathode layer, for example, an aluminum alloy base forms a galvanic cell with the fluorozirconate in the conversion solution in the process of being treating with the conversion solution, and a hydrogen evolution reaction or an oxygen absorption reaction happens, which causes a local pH increase in the conversion solution, and $Zr(OH)_4$ and $Al(OH)_3$ are formed in the local environment through a hydrolysis reaction. The two kinds of hydroxides $Zr(OH)_4$ and $Al(OH)_3$ are dehydrated into bonds under high temperature baking to form the Zr—O—Al crosslinked film layer. The crosslinked film layer is a good corrosion-resistant layer, which can prevent the cathode layer from directly contacting with water vapor and oxygen, etc.

Forming a network structure of the high valence manganese (Mn) (a repairing layer): the sodium polyaspartate added during the manufacturing process can be adsorbed on the cathode layer such as the aluminum alloy base, and a complex reaction happens between the sodium polyaspartate and the fluozirconate, so that a complex reaction happens between the sodium polyaspartate and Zr to generate Zr—O bonds, and in the baking process, cross-linking polymerization occurs by connecting the Zr—O bonds to form the network structure. At the same time, in the process that the local pH in the solution is increased, the manganese (Mn) is uniformly distributed in the network structure because of the existence of the sodium polyaspartate.

Since manganate does not participate in the reaction in the step, thus there is no need to use deionized water for treatment again.

After the above processing, all the Mn exists in the self-repairing layer in the form of the highest valence, and a construction of a network oxide film system is realized. In a case that, the cathode layer, for example, the aluminum alloy under the self-repairing layer is corroded by water vapor and oxygen, etc., because the equilibrium system is damaged, the high valence Mn can enter the microporous defects through the corrosive medium to polymerize and form the secondary protection, the cathode layer base is re-passivated by the oxidation-reduction reaction, the corrosion points are repaired, the flatness of the cathode layer is increased, and the good stability of the surface of the cathode layer is maintained.

Step 1007: treating the self-repairing layer with an ethanol solution containing perfluorosilane to form a waterproof layer.

In the example, by performing a hydrophobic treatment on a trace amount of organic matter on the surface of the self-repairing layer, the waterproof layer can be formed on the self-repairing layer, to further ensure the waterproof effect and the anti-oxidation effect of the aluminum alloy cathode. For example, the cathode layer provided with the self-repairing layer is immersed in the ethanol solution containing the perfluorosilane (PFAS) to form the waterproof layer. For example, in the ethanol solution containing the perfluorosilane, a mass fraction of the perfluorosilane is from 0.1% to 10%, for example, 1%. The time for treating the self-repairing layer by using the ethanol solution containing the perfluorosilane is from 1 h to 2 h, and the temperature for treating the self-repairing layer is from 20° C. to 40° C.

Step 1008: drying the cathode layer provided with the waterproof layer.

For example, the time of drying the cathode layer provided with the waterproof layer is from 5 minutes to 8 minutes, and the temperature of drying the cathode layer provided with the waterproof layer is from 80° C. to 90° C. For example, the process of drying the cathode layer provided with the waterproof layer may use a blast drying oven; or in some cases, the cathode layer provided with the waterproof layer is dried at a room temperature.

The manufacturing method of the organic light-emitting diode device provided by the embodiment of the present disclosure, can enhance a working stability of the cathode layer by forming the self-repairing layer containing the transition metal acid salt with the highest valence on the cathode layer, which effectively avoids problems such as electrode failure that may occur in the organic light-emitting diode device, furthermore, the luminous efficiency and the service life of the organic light-emitting diode device are improved. For example, in the manufacturing method of the organic light-emitting diode device provided by the embodiment of the present disclosure, the self-repairing layer is obtained by treating with the conversion solution, which enhances the working stability of the cathode layer such as the aluminum alloy cathode. In some embodiments, the waterproof layer is further formed on the self-repairing layer, which further ensures the waterproof effect and the anti-oxidation effect of the aluminum alloy cathode. Compared with other organic light-emitting diode devices that use a multilayer structure film or an encapsulation film to achieve the waterproof effect, the manufacturing method of the organic light-emitting diode device provided by the embodiment of the present disclosure achieves the waterproof effect and at the same time realizes the stability of the aluminum alloy cathode, and at the same time maintains an overall thickness of the organic light-emitting diode device to be thin.

At least one embodiment of the present disclosure further provides a display substrate, and the display substrate includes any one of the organic light-emitting diode devices mentioned above.

It can be seen from the above embodiments, the display substrate provided by the embodiments of the present disclosure, can enhance the working stability of the cathode layer by forming the self-repairing layer on the cathode layer of the organic light-emitting diode device, which effectively avoids problems such as electrode failure that may occur in the organic light-emitting diode device, furthermore, the luminous efficiency and the service life of the organic light-emitting diode device are improved, so that the luminous efficiency and service life of the display substrate are improved.

At least one embodiment of the present disclosure further provides a display device, and the display device includes the display substrate mentioned above. For example, the display device may be any products or components with a display function, such as electronic paper, mobile phone, tablet computer, television, notebook computer, digital photo frame, and navigator.

The display device provided by the embodiment of the present disclosure, can enhance the working stability of the cathode layer by forming the self-repairing layer on the cathode layer of the organic light-emitting diode device, which effectively avoids problems such as electrode failure that may occur in the organic light-emitting diode device, furthermore, the luminous efficiency and service life of the organic light-emitting diode device are improved, so that the luminous efficiency and the service life of the display device are improved.

The following should be noted:

(1) The accompanying drawings involve only the structure(s) in connection with the embodiment(s) of the present disclosure, and other structure(s) can be referred to common design(s);

(2) For clarity, in accompanying drawings for illustrating the embodiment(s) of the present disclosure, the thickness of a layer or a structure may be enlarged or reduced. However, it should understood that, in the case in which a component or element such as a layer, film, area, substrate or the like is referred to be "on" or "under" another component or element, it may be directly on or under the another component or element or a component or element is interposed therebetween; and (3) In case of no conflict, embodiments of the present disclosure and the features in the embodiments may be mutually combined to obtain new embodiments.

What have been described above are only specific implementations of the present disclosure, the protection scope of the present disclosure is not limited thereto. Changes or replacements that can be easily envisaged should be covered by the protection scope of the present disclosure, and thus the protection scope of the present disclosure should be based on the protection scope of the claims.

What is claimed is:

1. An organic light-emitting diode device, comprising:
   an anode layer, an organic light-emitting layer, and a cathode layer which are stacked; and
   a self-repairing layer, arranged on a side of the cathode layer away from the anode layer,
   wherein the self-repairing layer is applicable for repairing the cathode layer by an oxidation-reduction reaction; and
   the self-repairing layer comprises a transition metal acid salt with a highest valence.

2. The organic light-emitting diode device according to claim 1, wherein a transition metal in the transition metal acid salt with the highest valence comprises at least one selected from the group consisting of vanadium, manganese or chromium.

3. The organic light-emitting diode device according to claim 1, wherein the self-repairing layer further comprises at least one selected from the group consisting of zirconium, polyaspartate, fluoroborate or borate.

4. The organic light-emitting diode device according to claim 1, further comprising:
   a waterproof layer arranged on a side of the self-repairing layer away from the cathode layer.

5. The organic light-emitting diode device according to claim 1, wherein a material of the cathode layer comprises aluminum or aluminum alloy.

6. A display substrate, comprising the organic light-emitting diode device according to claim 1.

7. A display device, comprising the display substrate according to claim 6.

8. A method of manufacturing an organic light-emitting diode device, comprising:
   forming an anode layer, an organic light-emitting layer, and a cathode layer that are stacked; and
   forming a self-repairing layer on a side of the cathode layer away from the anode layer, wherein the self-repairing layer is applicable for repairing the cathode layer by an oxidation-reduction reaction, and the self-repairing layer comprises a transition metal acid salt with a highest valence.

9. The method according to claim 8, further comprising:
   forming a waterproof layer on a side of the self-repairing layer away from the cathode layer by performing a hydrophobic treatment with an organic substance.

10. The method according to claim 9, wherein the forming the waterproof layer comprises:
    treating the self-repairing layer with a solution containing perfluorosilane to form the waterproof layer.

11. The method according to claim 8, wherein before forming the self-repairing layer, the manufacturing method further comprises:
    cleaning the cathode layer and performing a surface activation treatment on the cathode layer.

12. The method according to claim 11, wherein the cleaning the cathode layer comprises treating the cathode layer with an ethanol-water solution including sodium carbonate;

in the ethanol-water solution including the sodium carbonate, a volume ratio of the ethanol to the water is from 1:4 to 1:3, and a mass concentration of the sodium carbonate is from 8 g/L to 10 g/L; and the performing the surface activation treatment on the cathode layer comprises performing an activating treatment on a surface of the cathode layer by using nitric acid, and a mass fraction of the nitric acid is from 10% to 15%.

13. The method according to claim 8, wherein the transition metal acid salt with the highest valence is formed by in-situ oxidizing the transition metal acid salt with a lower valence on the cathode layer.

14. The method according to claim 13, wherein a transition metal in the transition metal acid salt with the highest valence comprises at least one selected from the group of vanadium, manganese or chromium.

15. The method according to claim 13, wherein the forming the self-repairing layer comprises:

treating the cathode layer with a conversion solution to form a self-repairing conversion layer on the cathode layer, wherein the conversion solution comprises the transition metal acid salt with the lower valence; and treating the self-repairing conversion layer with an oxidant solution to convert the transition metal acid salt with the lower valence into the transition metal acid salt with the highest valence to form the self-repairing layer.

16. The method according to claim 15, wherein the treating the cathode layer with the conversion solution to form the self-repairing conversion layer on the cathode layer comprises:

contacting the cathode layer with the conversion solution, and adding polyaspartate to assist film formation in the process of the treating, wherein a mass concentration of the polyaspartate is from 0.4 g/L to 1 g/L.

17. The method according to claim 15, wherein the treating the self-repairing conversion layer with the oxidant solution to convert the transition metal acid salt with the lower valence into the transition metal acid salt with the highest valence comprises:

treating the self-repairing conversion layer with hydrogen peroxide as the oxidant solution to convert the transition metal acid salt with the lower valence into the transition metal acid salt with the highest valence, wherein a mass concentration of the hydrogen peroxide is from 1.5 g/L to 6 g/L, and a pH of the hydrogen peroxide is from 5.0 to 6.0.

18. The method according to claim 15, wherein the conversion solution comprises at least one selected from the group consisting of metavanadate, metachromate, manganate, fluoboric acid, potassium fluozirconate, boric acid, or sodium metavanadate.

19. The method according to claim 18, wherein the conversion solution comprises: the fluoboric acid with a mass concentration of from 0.2 g/L to 0.4 g/L, the potassium fluozirconate with a mass concentration of from 1.5 g/L to 3 g/L, the boric acid with a mass concentration of from 0.2 g/L to 0.4 g/L, and the sodium metavanadate with a mass concentration of from 3 g/L to 5 g/L, and a pH of the conversion solution is from 4.0 to 5.0.

* * * * *